United States Patent
Li et al.

(10) Patent No.: US 8,492,745 B2
(45) Date of Patent: Jul. 23, 2013

(54) EPITAXIAL STRUCTURE WITH AN EPITAXIAL DEFECT BARRIER LAYER

(75) Inventors: Hongjian Li, Wuhan (CN); Changtao Ai, Wuhan (CN); Jiangbo Li, Wuhan (CN); Caixia Jin, Wuhan (CN); Zhijiang Dong, Wuhan (CN)

(73) Assignee: Aqualite Co., Ltd., Wuhan (CN)

( * ) Notice: Subject to any disclaimer, the term of this patent is extended or adjusted under 35 U.S.C. 154(b) by 0 days.

(21) Appl. No.: 13/283,309

(22) Filed: Oct. 27, 2011

(65) Prior Publication Data

US 2012/0138947 A1    Jun. 7, 2012

(51) Int. Cl.
*H01L 31/00* (2006.01)

(52) U.S. Cl.
USPC .......... 257/13; 257/79; 257/98; 257/E33.069; 438/479

(58) Field of Classification Search
USPC ... 257/13, 79, 98, E33.005, E33.069; 438/29, 438/479, 481
See application file for complete search history.

(56) References Cited

U.S. PATENT DOCUMENTS

| | | | |
|---|---|---|---|
| 6,103,604 A * | 8/2000 | Bruno et al. | 438/584 |
| 6,861,270 B2 * | 3/2005 | Sakai | 438/22 |
| 7,101,444 B2 | 9/2006 | Shchukin et al. | |
| 7,105,895 B2 | 9/2006 | Wang et al. | |
| 8,202,752 B2 * | 6/2012 | Huang et al. | 438/47 |
| 8,349,633 B1 * | 1/2013 | Allerman et al. | 438/46 |
| 2008/0067916 A1 | 3/2008 | Hsu et al. | |
| 2009/0256159 A1 | 10/2009 | Lin et al. | |
| 2009/0278165 A1 * | 11/2009 | Chang et al. | 257/103 |
| 2010/0184279 A1 | 7/2010 | Wuu et al. | |

* cited by examiner

*Primary Examiner* — Tuan N. Quach
(74) *Attorney, Agent, or Firm* — Lathrop & Gage LLP

(57) ABSTRACT

An epitaxial structure for an LED is provided. The epitaxial structure includes a patterned epitaxial defect barrier layer disposed over a first portion of a substantially flat substrate to expose a second portion of the substrate. The epitaxial structure also includes a patterned buffer layer over the second portion of the substrate. The epitaxial structure further includes a first semiconductor layer over the patterned buffer layer and the patterned epitaxial defect barrier layer, an active layer over the first semiconductor layer, and a second semiconductor layer over the active layer.

15 Claims, 10 Drawing Sheets

EPITAXIAL STRUCTURE WITH AN EPITAXIAL DEFECT BARRIER LAYER

CROSS REFERENCE TO RELATED APPLICATIONS

This application claims priority to Chinese Patent Application No. 201010572246.8, entitled "An Epitaxial structure with an epitaxial defect barrier layer," filed on Dec. 3, 2010, which is incorporated herein by reference in its entirety.

TECHNICAL FIELD

The invention relates to semiconductor field and specifically relates to an Light Emitting Diode (LED) device that includes an epitaxial structure with an epitaxial defect barrier layer.

BACKGROUND

Epitaxial defects influence the Quantum efficiency of an LED device. During deposition of an epitaxial structure on a substrate, various non-radioactive defects appear because of lattice mismatch and thermal expansion mismatch between the substrate and the epitaxial structure. Defects, such as dislocation, may have a density raging from $10^9$ cm$^{-2}$ to $10^{11}$ cm$^{-2}$. As a result, spontaneous polarization and piezoelectric effect may generate a significantly built-in electric field, which reduces luminous efficiency of the LED. LED device temperature increases as injected current increases, such that the LED device wavelength may drift and the luminous efficiency may be reduced, i.e. Droop phenomenon.

A conventional epitaxial structure is formed on a substrate by thin film depositions. FIG. 1 is a schematic diagram of a conventional LED device. Conventional LED device 100 includes epitaxial layers 114 formed on a buffer layer 104 over a flat substrate 102. The epitaxial layers 114 include an n-type semiconductor 106, an active layer 108 for light emission, and a p-type semiconductor 110. The buffer layer 104 is added between the substrate 102 and the epitaxial layers 114 to help reduce epitaxial layers 114 defect density. However, the conventional epitaxial structure often has a high a leakage current and a low production yield.

FIG. 2 is a schematic diagram of a conventional LED device on a patterned sapphire substrate (PSS). As illustrated in FIG. 2, a conventional LED device 200 includes epitaxial layers 214 formed on patterned sapphire substrate 202. A buffer layer 204 covers bumps 212 of PSS 202. Epitaxial layers 214 are formed over buffer layer 204. Again, the buffer layer 204 is added to reduce defect density of the epitaxial layers 214.

Various developments have been made toward reducing epitaxial defect density. Dong-Sing Wuu, in US Patent Publication No. 2010/0184279A1, entitled "Method of Making an Epitaxial Structure Having Low Defect Density", filed on Jan. 15, 2010, discloses an epitaxial structure with relatively low defect density. Wuu discloses that a first epitaxial layer is laterally formed on a substrate, and then the first epitaxial layer is etched to form some pits or recesses on the surface of the first epitaxial layer. Wuu further discloses that a defect-termination layer is deposited on the first epitaxial layer and a portion of the defect-termination layer is removed by a chemical mechanical polishing process to form a plurality of defect-termination blocks that fill the recesses on the surface of the first epitaxial layer. The defect-termination blocks have polished surfaces that are substantially flush with surface of the first epitaxial layer. However, it is very difficult to accurately control the cleanness of the etching treatment and the shape of the pits or recesses. This method may have a high risk for increasing defect density.

Lin, in US Patent Publication No. 2009/0256159A1, entitled "GAN Semiconductor Device", filed on Mar. 27, 2009, discloses a buffer layer on a flat substrate. Lin also discloses an amorphous metal-rich nitride thin film covering a partial upper surface of the flat substrate. Because the metal-rich nitride is amorphous, the epitaxial growth direction of the buffer layer grows upwards in the beginning and then turns laterally. The probability of the epitaxial defects extending to the semiconductor stack layer is reduced and the reliability of the GaN semiconductor device is improved. Although Lin's method may reduce defect density, the method does not improve light emission.

Hsu, in US Patent Publication No. 2008067916A1, entitled "light Emitting Device Having a Patterned Substrate and the Method Thereof", filed on Jul. 30, 2007, discloses an epitaxial structure grown on a patterned sapphire substrate (PSS) to reduce defect density. However, Hsu's method improves light emission only slightly.

There still remains a need for developing methods for reducing defect density and improving light emission for LED devices.

SUMMARY

This disclosure advances the art at least by providing an LED device including an epitaxial structure with an epitaxial defect barrier layer. This epitaxial structure reduces defect density and improves the efficiency of the LED device. The epitaxial defect barrier layer may be a Distributed Bragg Reflector (DBR) deposited on a flat substrate or a PSS such that light emission can be greatly enhanced.

In an embodiment, an epitaxial structure for an LED includes a patterned epitaxial defect barrier layer disposed over a first portion of a substantially flat substrate to expose a second portion of the substrate. The epitaxial structure also includes a patterned buffer layer over the second portion of the substrate. The epitaxial structure further includes a first semiconductor layer over the patterned buffer layer and the patterned epitaxial defect barrier layer, an active layer over the first semiconductor layer, and a second semiconductor layer over the active layer.

In a particular embodiment, the patterned epitaxial defect barrier layer includes a plurality of protrusions and a plurality of recesses between the plurality of protrusions, the patterned buffer layer being over the second portion of the substrate in the plurality of recesses. The patterned epitaxial defect barrier layer includes a multi-layer structure including a first plurality of layers of a first material and a second plurality of layers of a second material different from the first material to form a Distributed Bragg Reflector (DBR), the first plurality of layers being interleaved with the second plurality of layers. Each of the first material and the second material includes a material selected from the group consisting of $TiO_2$, $SiN_x$, $SiO$, and $SiO_2$. The substrate includes a material selected from the group consisting of sapphire, silicon carbide, silicon, aluminum nitride, and zinc oxide. The first semiconductor layer includes n-type GaN and the second semiconductor layer includes p-type GaN. The patterned buffer layer includes $Al_yIn_xGa_{1-x-y}N$, where $0 \leq x \leq 1$, $0 \leq y \leq 1$, and $0 \leq x+y \leq 1$.

In another embodiment, an epitaxial structure for an LED device includes a patterned epitaxial defect barrier layer disposed over a first portion of a patterned sapphire substrate (PSS). The epitaxial structure also includes a patterned buffer layer disposed over a second portion of the PSS and exposing the patterned epitaxial defect barrier layer. The epitaxial structure further includes a first semiconductor layer disposed over the patterned buffer layer and the patterned epitaxial defect barrier layer, an active layer disposed over the first semiconductor layer, and a second semiconductor layer disposed over the active layer.

In a particular embodiment, the patterned epitaxial defect barrier layer includes a multi-layer structure including a first plurality of layers of a first material and a second plurality of layers of a second material different from the first material to form a Distributed Bragg Reflector (DBR), the first plurality of layers being interleaved with the second plurality of layers. Each of the first material and the second material includes a material selected from the group consisting of titanium oxide ($TiO_2$), silicon nitride ($SiN_x$), silicon oxide (SiO), and silicon dioxide ($SiO_2$). The PSS includes a material selected from the group consisting of sapphire, silicon carbide, silicon, aluminum nitride, and zinc oxide. The first semiconductor layer includes n-type gallium nitride (GaN) and the second semiconductor layer includes p-type GaN. The patterned buffer layer includes non-doped $Al_yIn_xGa_{1-x-y}N$, where $0 \leq x \leq 1$, $0 \leq y \leq 1$, and $0 \leq x+y \leq 1$. The first portion of the PSS includes a plurality of bumps and the second portion of the PSS is substantially flat such that the patterned epitaxial defect barrier layer is over the plurality of the bumps and the patterned buffer layer is over the substantially flat second portion. The second portion of the PSS includes a plurality of bumps and the first portion of the PSS is substantially flat such that the patterned epitaxial defect barrier layer is over the flat first portion and the patterned buffer layer is over the plurality of bumps.

In a further embodiment, a method for fabricating an epitaxial structure for an LED device is provided. The method includes depositing an epitaxial defect barrier layer over a substrate and patterning the epitaxial defect barrier layer by lithography and etching to cover a first portion of the substrate with a patterned epitaxial barrier layer and to expose a second portion of the substrate. The method also includes forming a patterned buffer layer over the second portion of substrate and disposing epitaxial layers over the patterned epitaxial defect barrier layer and the patterned buffer layer.

In a particular embodiment, the step of disposing epitaxial layers includes (1) forming an n-type semiconductor layer over the patterned epitaxial defect barrier layer and the patterned buffer layer, (2) depositing an active layer over the n-type semiconductor layer, and (3) disposing a p-type semiconductor layer over the active layer. The patterned epitaxial defect barrier layer includes a multi-layer structure including a first plurality of layers of a first material and a second plurality of layers of a second material different from the first material to form a Distributed Bragg Reflector (DBR), the first plurality of layers being interleaved with the second plurality of layers. Each of the first material and the second material includes a material selected from the group consisting of $TiO_2$, $SiN_x$, SiO, and $SiO_2$. The substrate includes a material selected from the group consisting of sapphire, silicon carbide, silicon, aluminum nitride, and zinc oxide. The first semiconductor layer includes an n-type GaN and the second semiconductor layer includes p-type GaN. The buffer layer includes $Al_yIn_xGa_{1-x-y}N$, where $0 \leq x \leq 1$, $0 \leq y \leq 1$, and $0 \leq x+y \leq 1$. The substrate includes a PSS having a plurality of bumps or protrusions or is substantially flat.

Additional embodiments and features are set forth in the description that follows, and will become apparent to those skilled in the art upon examination of the specification or may be learned by the practice of the invention. A further understanding of the nature and advantages of the present invention may be realized by reference to the remaining portions of the specification.

DETAILED DESCRIPTION

Figure 1:
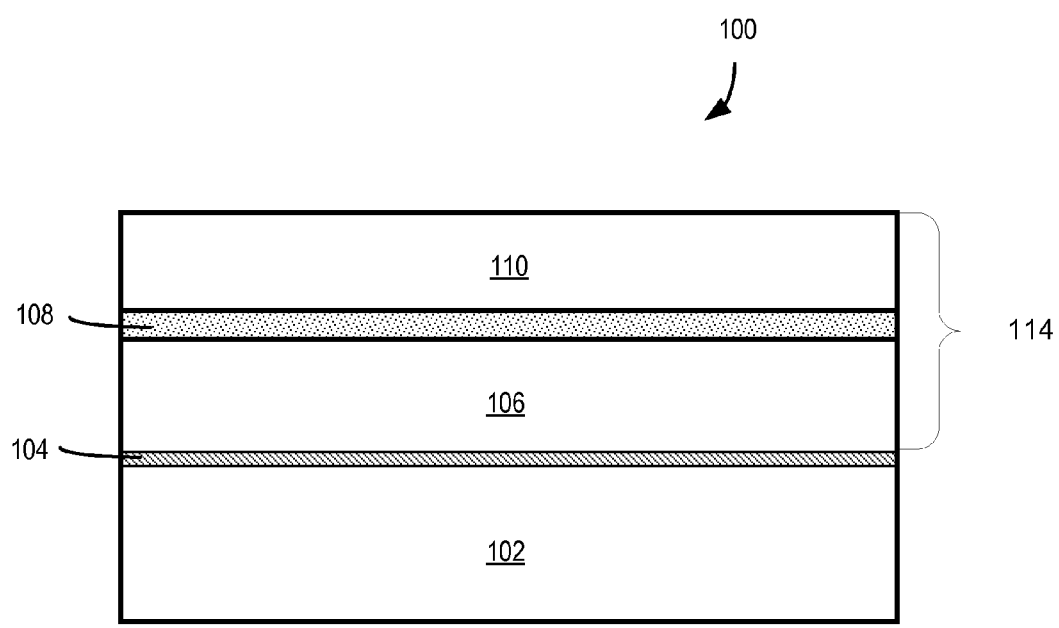
FIG. 1 is a schematic diagram of a conventional LED device on a flat substrate.
Figure 2:
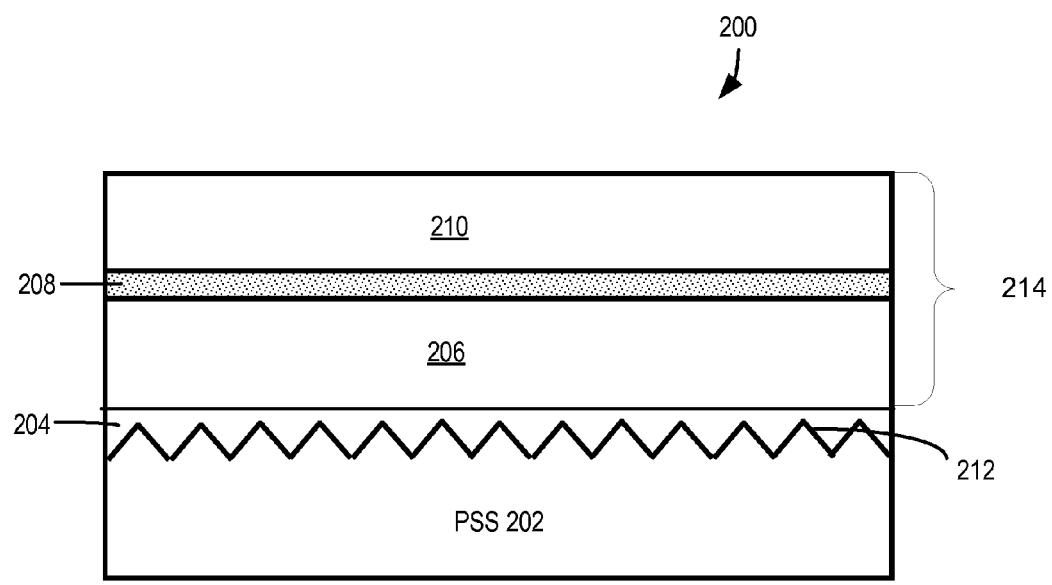
FIG. 2 is a schematic diagram of a conventional LED on a patterned sapphire substrate (PSS).

The present disclosure may be understood by reference to the following detailed description considered in conjunction with the drawings. Note that, for purposes of illustrative clarity, certain elements in the drawings are not drawn to scale.

Epitaxial defects are produced because of lattice mismatch between the epitaxial structure and the substrate. The present disclosure provides a patterned barrier layer and a patterned buffer layer between the epitaxial structure and the substrate which may (1) reduce defect density, (2) improve epitaxial structure quality, (3) reduce light absorption of the epitaxial structure, (4) reduce current leak, and/or (5) improve LED device luminous efficiency.

Figure 3:
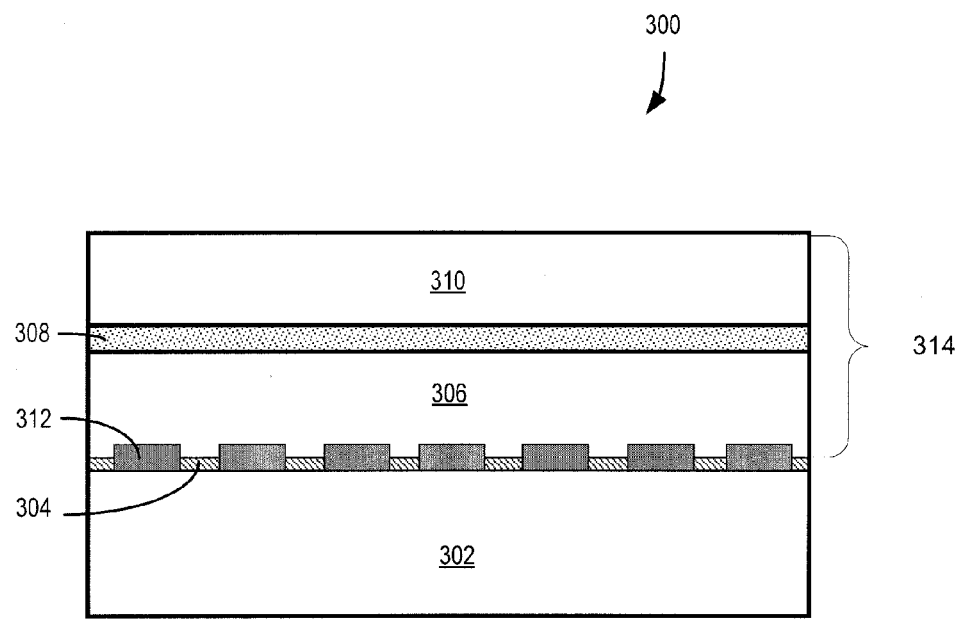
FIG. 3 is a schematic diagram of an LED device including an epitaxial structure and an epitaxial defect barrier layer on a substantially flat substrate in an embodiment.
Figure 7:
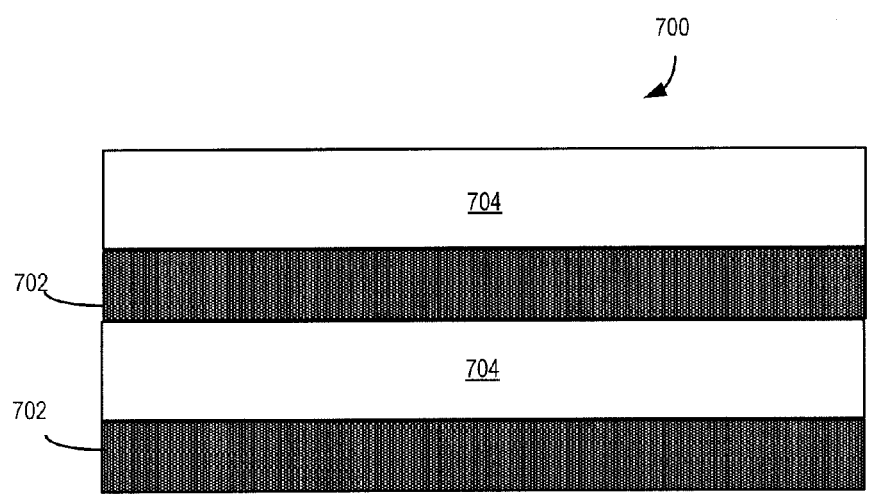
FIG. 7 is an exemplary schematic diagram of the epitaxial defect barrier layer of FIGS. 3-6.

FIG. 3 is a schematic diagram of an LED device including an epitaxial structure with an epitaxial defect barrier layer on a substantially flat substrate in an embodiment. LED device 300 includes epitaxial layers 314 formed on a patterned buffer layer 304 and a patterned epitaxial defect barrier layer 312, which are in turn formed on a substantially flat substrate 302. The epitaxial structure includes epitaxial layers 314, patterned buffer layer 304 and patterned epitaxial defect barrier layer 312. The substrate 302 may be formed of sapphire, silicon carbide (SiC), silicon (Si), aluminum nitride (AlN), or zinc oxide (ZnO), among others. Epitaxial layers 314 include several epitaxial layers 306, 308 and 310, such as semiconductor layers for an LED device. Before deposition of the epitaxial layers 306, 308 and 310, a patterned epitaxial defect barrier layer 312 is formed on substrate 302 by using lithography and etching technique. Specifically, an epitaxial defect barrier layer is first deposited on substrate 302, and a patterned photoresist layer is then coated on the epitaxial defect barrier layer. By using the lithography and etching technique, a patterned layout is formed on the epitaxial defect barrier layer to generate the patterned epitaxial defect barrier layer 312, which includes a plurality of protrusions and recesses between the protrusions. The substrate 302 is not covered in the recesses of the patterned epitaxial barrier layer 312. More details of the barrier layer 312 are illustrated in FIG. 7 and described in related text below.

Buffer layer 304 is then deposited in the recesses between the barrier layer 312 protrusions after etching. Buffer layer 304 does not cover the top portion of the barrier layer 312 protrusions, such that the buffer layer 304 is patterned. In this particular embodiment, the barrier layer 312 is thicker than the buffer layer 304. It will be appreciated by those skilled in the art that the barrier layer may be equal to or thinner than the buffer layer. The buffer layer 304 may include $Al_yIn_xGa_{1-x-y}N$, where $0 \leq x \leq 1$, $0 \leq y \leq 1$, and $0 \leq x+y \leq 1$. The buffer layer 304 is also typically non-doped. In a particular embodiment, the buffer layer 304 may be formed of non-doped gallium nitride (GaN).

Epitaxial layers 314 are then formed on the patterned buffer layer 304 and the patterned epitaxial defect barrier layer 312. Specifically, an n-type GaN layer 306, an active layer 308, such as a multi-quantum well (MQW) active layer, and a p-type GaN layer 310, are sequentially deposited on buffer layer 304 and barrier layer 312, to form epitaxial layers 314. The MQW active layer 308 may emit red, green, and blue light.

LED device 300 is typically better at blocking defects and reflecting light than the conventional LED device 100 on a substantially flat substrate. The patterned epitaxial defect barrier layer 312 and patterned buffer layer 304 can reduce the number of lattice defects, such that the defect density can be reduced to below $10^6$ cm$^{-2}$. Normally, the defect density for epitaxial layers grown on a flat sapphire substrate is $10^8 \sim 10^{10}$ cm$^{-2}$. As a result of reduction in epitaxial defect density from $10^8 \sim 10^{10}$ cm$^{-2}$ to $10^6$ cm$^{-2}$, the quality of the epitaxial layers 314 is improved, the light absorption of the epitaxial layers 314 or crystal is reduced, and the luminous efficiency of the LED device 300 may be improved by approximately 30%.

Figure 4:
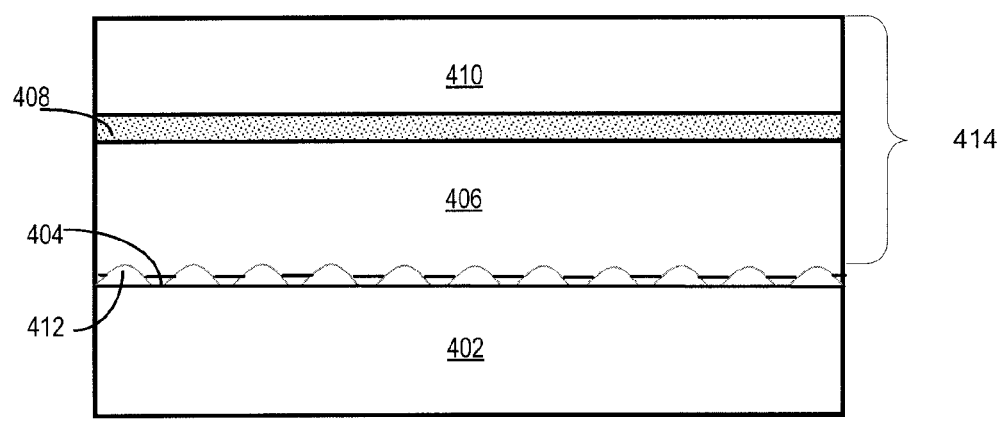
FIG. 4 is a schematic diagram of an LED device including an epitaxial structure and an epitaxial defect barrier layer on a substantially flat substrate in another embodiment.

FIG. 4 illustrates an LED device including an exemplary epitaxial structure with an epitaxial defect barrier layer for reducing defects in another embodiment. LED device 400 includes epitaxial layers 414 formed on a patterned buffer layer 404 and a patterned epitaxial defect barrier layer 412, which are both formed on a substantially flat substrate 402. The exemplary epitaxial structure includes epitaxial layers 414, patterned buffer layer 404 and patterned epitaxial defect barrier layer 412. The LED device 400 differs from the LED device 300 in the patterns of the barrier layer 412 and buffer layer 404. Note that barrier layer 412 includes a plurality of bumps formed on the substantially flat substrate 402, and is first formed over the substrate 402. The buffer layer 404 then grows in the recess areas between the bumps of the barrier layer 412 on the substrate 402, but does not cover the top portion of the bumps of the barrier layer 412. Thus, buffer layer 404 patterned. The patterned epitaxial defect barrier bumps on the substrate 402 form a pattern similar to that of a PSS, but include a material different than that forming substrate 402.

The patterned epitaxial defect barrier layer 412 may be formed by lithography and etching techniques. For example, a barrier layer is first deposited over substrate 402, and a portion of the barrier layer is then removed to form a plurality of recesses between the patterned epitaxial defect barrier bumps. Buffer layer 404 is then formed on the substrate 402 in the plurality of recesses. In a particular embodiment, the buffer layer 404 includes a non-doped GaN. The epitaxial layers 414 including an n-type GaN layer 406, a MQW active layer 408, and a p-type GaN layer 410, is then deposited over the patterned buffer layer 404 and the patterned epitaxial defect barrier layer 412. Defect barrier layer 412 promotes high epitaxial layers 414 quality and reduced lattice mismatch between substrate 402 and epitaxial layers 414. For example, inclusion of barrier layer 414 may reduce epitaxial layers 414 defect density to about $10^6$ cm$^{-2}$, such that LED device 400 luminous efficiency increases by about 20%, relative to a device without barrier layer 412.

Figure 5:
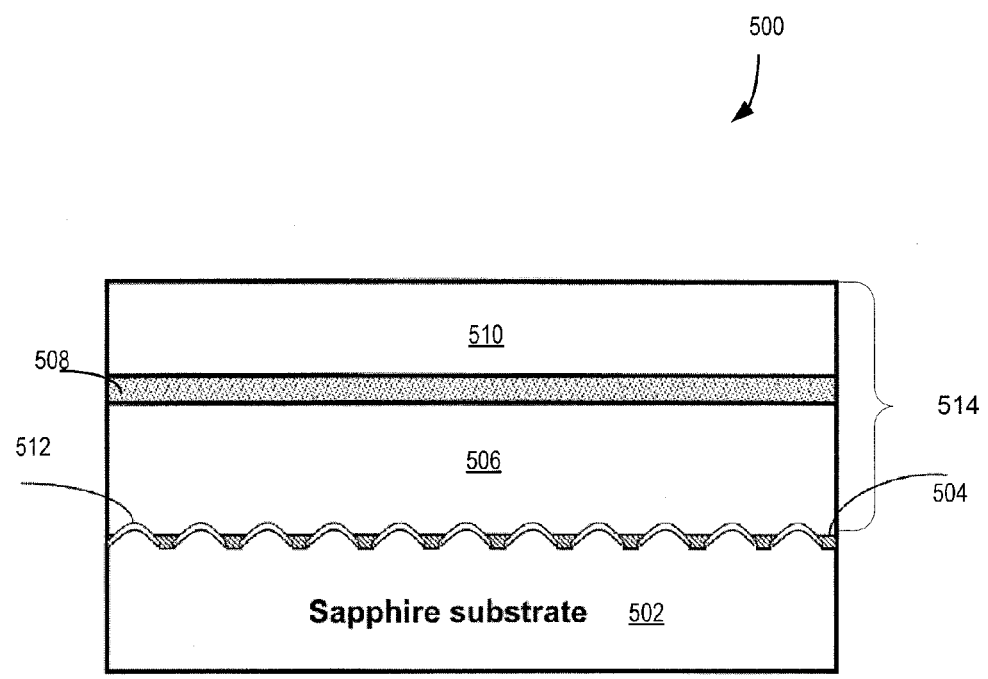
FIG. 5 is a schematic diagram of an LED device including an epitaxial structure and an epitaxial defect barrier layer on a patterned sapphire substrate (PSS) in an embodiment.

FIG. 5 is a schematic diagram of an LED device including an epitaxial structure with an epitaxial defect barrier layer on a patterned sapphire substrate (PSS). LED device 500 includes epitaxial layers 514 formed over a patterned epitaxial defect barrier layer 512 and a patterned buffer layer 504, which are deposited over a PSS 502. The epitaxial structure includes epitaxial layers 514, patterned buffer layer 504 and patterned epitaxial defect barrier layer 512. In this embodiment, patterned epitaxial defect barrier layer 512 is first formed on a plurality of bumps of PSS 502. Patterned buffer layer 504 then grows on PSS 502 in the recess area between the bumps of the patterned epitaxial defect barrier layer 512, such that the buffer layer 504 is patterned. Epitaxial layers 514 are formed on both the bumps of the patterned epitaxial defect barrier layer 512 and the patterned buffer layer 504.

The patterned epitaxial defect barrier layer 512 may be formed by lithography and etching techniques, such that a portion of the barrier layer is removed to form a plurality of recesses. After etching, the buffer layer 504 is formed on the PSS 502 in the plurality of recesses of the barrier layer 512. In a particular embodiment, buffer layer 504 includes non-doped GaN. The epitaxial layers 514 including an n-type GaN layer 506, a MQW active layer 508, and a p-type GaN layer 510 is then deposited over the patterned buffer layer 504 and the patterned epitaxial defect barrier layer 512.

LED device 500 has a similar pattern to LED device 400. As a result of using the patterned epitaxial defect barrier layer 512 and buffer layer 504, quality of the epitaxial layers 514 is improved, and lattice mismatch between the substrate 502 and the epitaxial layers 514 is inhibited. For example, use of barrier layer 512 may reduce defect density to about $10^6$ cm$^{-2}$, thereby enhancing LED device luminous efficiency by about 15%, relative to a device without barrier layer 512.

Figure 6A:
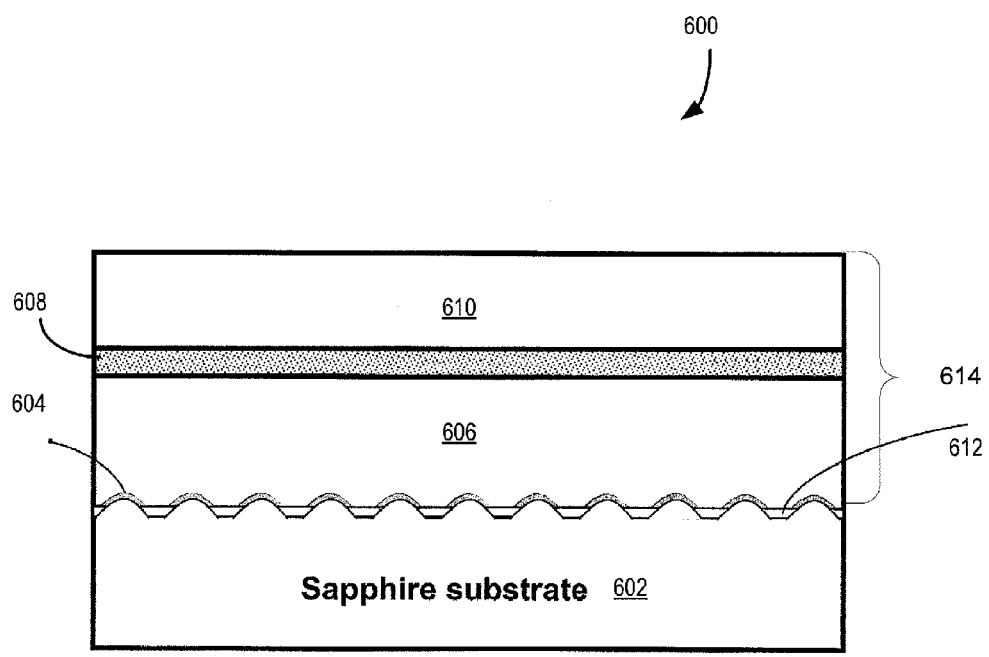
FIG. 6A is a schematic diagram of an LED device including an epitaxial structure and an epitaxial defect barrier layer on a patterned sapphire substrate (PSS) in another embodiment.
Figure 6B:
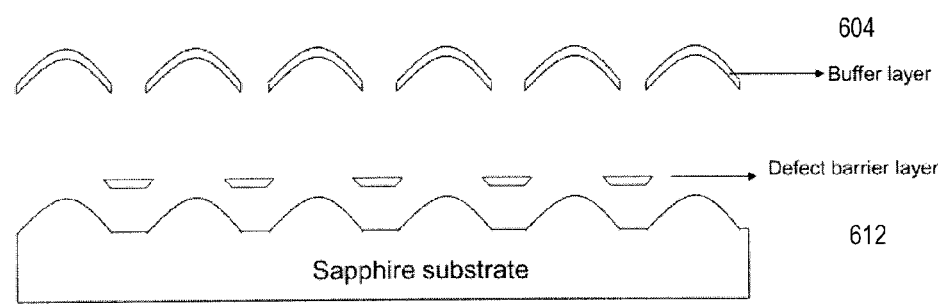
FIG. 6B is an enlarged schematic diagram of the LED device including an epitaxial structure and an epitaxial defect barrier layer on a patterned sapphire substrate (PSS) of FIG. 6A prior to deposition.

FIG. 6A is a schematic diagram of an LED device including an epitaxial structure with an epitaxial defect barrier layer on a patterned sapphire substrate (PSS) in another embodiment. FIG. 6B is an enlarged schematic diagram of the LED device including an epitaxial structure and an epitaxial defect barrier layer on a patterned sapphire substrate (PSS) of FIG. 6A prior to deposition.

In this embodiment, a patterned epitaxial defect barrier layer 612 is first formed in recess areas between bumps of PSS 602. A buffer layer 604 then grows on bumps of the PSS 602, such that epitaxial layers 614 is formed on both the patterned epitaxial defect barrier layer 612 and the patterned buffer layer 604. The epitaxial structure includes epitaxial layers 614, patterned buffer layer 604 and patterned epitaxial defect barrier layer 612.

The patterned epitaxial defect barrier layer 612 may be formed by lithography and etching techniques, such that an epitaxial defect barrier layer is first formed over the PSS 602 and a portion of the barrier layer is then removed to expose a plurality of bumps of the PSS 602 to form a patterned epitaxial defect barrier layer 612. After etching, the buffer layer 604 is formed on the bumps of PSS 602 and is thus patterned. In a particular embodiment, the buffer layer 604 includes non-doped GaN. The epitaxial layers 614, including an n-type GaN layer 606, a MQW active layer 608, and a p-type GaN layer 610, is then deposited over the patterned buffer layer 604 and the patterned epitaxial defect barrier layer 612.

LED device 600 is typically better at blocking defects and reflecting light than the conventional LED device 200 on a PSS. Use of barrier layer 612 improves quality of the epitaxial layers 614 and reduces lattice mismatch between substrate 602 and the epitaxial layers 614. For example, use of barrier layer 612 may reduce defect density to about $10^5$ cm$^{-2}$, and thereby increase LED device 600 luminous efficiency by 15%, relative to conventional LED device 200.

LED device 600 may be more effective than LED devices 300, 400, and 500 in preventing substrate epitaxial defects from extending into the epitaxial structure. Because in LED device 600, the epitaxial layer can only grow on the bumps of the PSS, the bumps are curved shapes, so that the epitaxial growth directions are not mainly in a c-axis direction which perpendicular to the substrate, but in various directions, which is referred to Lateral Epitaxial Overgrowth (LEO). Normally, GaN epitaxial layers grow in the c-axis direction and result the active layer to have a strong built-in electric field and lower light emission efficiency. The epitaxial growth in various directions can overcome the problem with epitaxial growth in only c-axis direction and help improve the light efficiency.

Barrier layer 312, 412, 512, or 612 each optionally includes a Distributed Bragg Reflector (DBR) to reflect light and/or to prevent a substrate defect from growing or extending into respective epitaxial layers 314, 414, 514, or 614. The DBR may be formed from multiple layers of alternating materials with varying refractive index. For example, FIG. 7 illustrates a schematic diagram of a multi-layer structure 700, which is included in certain embodiments of barrier layer 304, 404, 504 or 604. In this particular embodiment, the multi-layer structure 700 includes at least a first layer of a first material 702 and a second layer of a second material 704 different from the first material 702. The multi-layer structure 700 may also include a third layer of the first material 702 over the second layer and a fourth layer of the second material 704 over the third layer. Likewise, additional layers of first and second materials 702 and 704 may be interleaved to form the multi-layer structure 700. Each of the first and second material 702 and 704 may include titanium oxide (TiO$_2$), silicon nitride (SiN$_x$), silicon oxide (SiO) or silicon dioxide (SiO$_2$). The DBR helps improve light emission from the LED. The DBR is a reflector commonly used in waveguides, such as optical fibers. The DBR is formed from multiple layers of alternating materials with varying refractive index, or by periodic variation of some characteristic (such as height) of a dielectric waveguide, resulting in periodic variation in the effective refractive index in the guide. Each layer boundary causes a partial reflection of a light wave. For a light wave with a wavelength close to four times of the thickness of the layers, the many reflections of the light wave are combined to produce constructive interference such that the layers act as a high-quality reflector.

Figure 8:
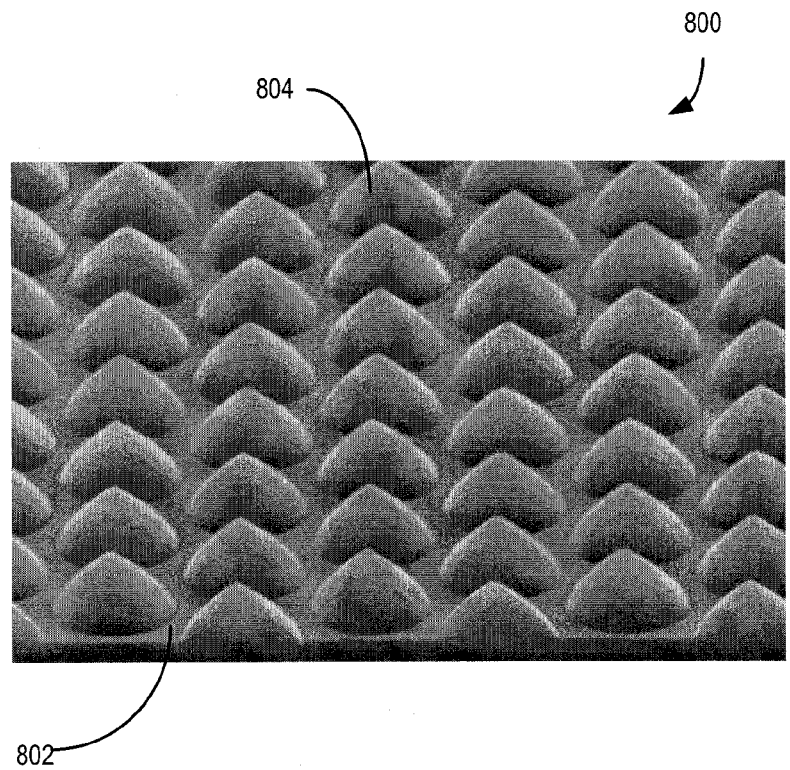
FIG. 8 is an exemplary image of the PSS of FIGS. 5-6.

FIG. 8 illustrates an exemplary image of the PSS of FIGS. 5-6. Note that PSS 800 includes a plurality of bumps 804 on a substantially flat substrate 802.

Figure 9:
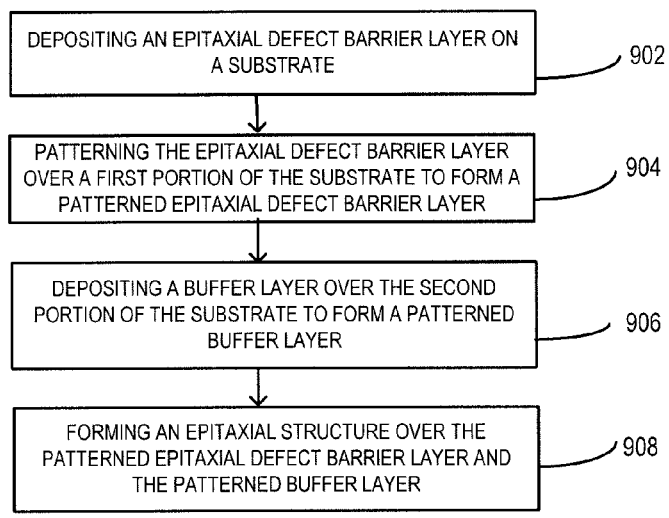
FIG. 9 is a flow chart illustrating the steps for fabricating an LED device including an epitaxial structure with an epitaxial defect barrier layer in an embodiment.

MOCVD, ICP, sputtering, vacuum evaporation, E-beam evaporation, and/or lithography may be used to fabricate certain of the LED epitaxial structures disclosed herein, such as certain embodiments of epitaxial structures 314, 414, 514, or 614. FIG. 9 is a flow chart illustrating steps for fabricating an LED including an epitaxial structure. The method begins by depositing an epitaxial defect barrier layer over a substrate at step 902, which may be a substantially flat substrate or a PSS. The method continues by patterning the epitaxial defect barrier layer to cover a first portion of the substrate and expose a second portion of the substrate at step 904. At step 906, a buffer layer is deposited over the second portion of the substrate. At step 908, an epitaxial structure is deposited over the patterned epitaxial defect barrier layer and the patterned buffer layer.

The epitaxial structure including a patterned epitaxial defect barrier layer and a patterned buffer layer promote minimal lattice defects. For example, lattice defect density can be reduced to below $10^6$ cm$^{-2}$, which improves epitaxial structure quality and reduces epitaxial structure or crystal light absorption. The barrier layer optionally includes a multilayer structure DBR including two alternative materials, which improves LED light emission. As a result, LED device luminous efficiency may be improved by approximately 15% to 30%.

Having described several embodiments, it will be recognized by those skilled in the art that various modifications, alternative constructions and equivalents may be used without departing from the spirit of the disclosure. Additionally, a number of well known mathematical derivations and expressions, processes and elements have not been described in order to avoid unnecessarily obscuring the present disclosure. Accordingly, the above description should not be taken as limiting the scope of the disclosure.

It should thus be noted that the matter contained in the above description or shown in the accompanying drawings should be interpreted as illustrative and not in a limiting sense. The following claims are intended to cover generic and specific features described herein, as well as all statements of the scope of the present method and system.

What is claimed is:

1. An epitaxial structure for an LED, comprising:
a patterned epitaxial defect barrier layer disposed over a first portion of a substantially flat substrate to expose a second portion of the substrate;
a patterned buffer layer over the second portion of the substrate;
a first semiconductor layer over the patterned buffer layer and the patterned epitaxial defect barrier layer;
an active layer over the first semiconductor layer; and
a second semiconductor layer over the active layer.

2. The structure of claim 1, wherein the patterned epitaxial defect barrier layer comprises a plurality of protrusions and a plurality of recesses between the plurality of protrusions, the patterned buffer layer being over the second portion of the substrate in the plurality of recesses.

3. The structure of claim 1, wherein the patterned epitaxial defect barrier layer comprises a multi-layer structure including a first plurality of layers of a first material and a second plurality of layers of a second material different from the first material to form a Distributed Bragg Reflector (DBR), the first plurality of layers being interleaved with the second plurality of layers.

4. The structure of claim 3, wherein each of the first material and the second material comprises a material selected from the group consisting of TiO$_2$, SiN$_x$, SiO, and SiO$_2$.

5. The structure of claim 1, wherein the substrate comprises a material selected from the group consisting of sapphire, silicon carbide, silicon, aluminum nitride, and zinc oxide.

6. The structure of claim 1, wherein the first semiconductor layer comprises n-type GaN and the second semiconductor layer comprises p-type GaN.

7. The structure of claim 1, wherein the patterned buffer layer comprises $Al_yIn_xGa_{1-x-y}N$, wherein $0 \leq x \leq 1$, $0 \leq y \leq 1$, and $0 \leq x+y \leq 1$.

8. An epitaxial structure for an LED device, comprising:
a patterned epitaxial defect barrier layer disposed over a first portion of a patterned sapphire substrate (PSS);
a patterned buffer layer disposed over a second portion of the PSS and exposing the patterned epitaxial defect barrier layer;
a first semiconductor layer disposed over the patterned buffer layer and the patterned epitaxial defect barrier layer;
an active layer disposed over the first semiconductor layer; and
a second semiconductor layer disposed over the active layer.

9. The structure of claim 8, wherein the patterned epitaxial defect barrier layer comprises a multi-layer structure including a first plurality of layers of a first material and a second plurality of layers of a second material different from the first material to form a Distributed Bragg Reflector (DBR), the first plurality of layers being interleaved with the second plurality of layers.

10. The structure of claim 9, wherein each of the first material and the second material comprises a material selected from the group consisting of titanium oxide ($TiO_2$), silicon nitride ($SiN_x$), silicon oxide (SiO), and silicon dioxide ($SiO_2$).

11. The structure of claim 8, wherein the PSS comprises a material selected from the group consisting of sapphire, silicon carbide, silicon, aluminum nitride, and zinc oxide.

12. The structure of claim 8, wherein the first semiconductor layer comprises n-type gallium nitride (GaN) and the second semiconductor layer comprises p-type GaN.

13. The structure of claim 8, wherein the patterned buffer layer comprises non-doped $Al_yIn_xGa_{1-x-y}N$, wherein $0 \leq x \leq 1$, $0 \leq y \leq 1$, and $0 \leq x+y \leq 1$.

14. The structure of claim 8, wherein the first portion of the PSS comprises a plurality of bumps and the second portion of the PSS is substantially flat such that the patterned epitaxial defect barrier layer is over the plurality of the bumps and the patterned buffer layer is over the substantially flat second portion.

15. The structure of claim 8, wherein the second portion of the PSS comprises a plurality of bumps and the first portion of the PSS is substantially flat such that the patterned epitaxial defect barrier layer is over the flat first portion and the patterned buffer layer is over the plurality of bumps.

* * * * *